US010635988B2

(12) United States Patent
Lutchyn et al.

(10) Patent No.: US 10,635,988 B2
(45) Date of Patent: Apr. 28, 2020

(54) MEASURING AND MANIPULATING STATES OF NON-ABELIAN QUASIPARTICLES VIA QUANTUM DOT HYBRIDIZATION ENERGY SHIFTS

(71) Applicant: Microsoft Technology Licensing, LLC, Redmond, WA (US)

(72) Inventors: Roman Lutchyn, Santa Barbara, CA (US); Parsa Bonderson, Santa Barbara, CA (US); Michael Freedman, Santa Barbara, CA (US); Torsten Karzig, Goleta, CA (US); Chetan Nayak, Santa Barbara, CA (US); Jason Alicea, Pasadena, CA (US); Christina Knapp, Goleta, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 262 days.

(21) Appl. No.: 15/634,983

(22) Filed: Jun. 27, 2017

(65) Prior Publication Data
US 2018/0053113 A1    Feb. 22, 2018

Related U.S. Application Data

(60) Provisional application No. 62/378,218, filed on Aug. 23, 2016, provisional application No. 62/376,386, filed on Aug. 17, 2016.

(51) Int. Cl.
| | |
|---|---|
| H03K 17/92 | (2006.01) |
| G06N 10/00 | (2019.01) |
| H01L 27/18 | (2006.01) |
| H01L 39/22 | (2006.01) |

(52) U.S. Cl.
CPC ............ *G06N 10/00* (2019.01); *H01L 27/18* (2013.01); *H01L 39/221* (2013.01)

(58) Field of Classification Search
CPC ...... H03K 17/92; H03K 19/1952; H03K 3/38; G01R 13/342; G11C 11/44
USPC .................................................. 327/367, 528
See application file for complete search history.

(56) References Cited

U.S. PATENT DOCUMENTS

| | | |
|---|---|---|
| 3,578,968 A | 5/1971 | Hellwig |
| 8,209,279 B2 | 6/2012 | Freedman et al. |
| 8,583,903 B2 | 11/2013 | Freedman et al. |
| 8,620,855 B2 | 12/2013 | Bonderson |

(Continued)

OTHER PUBLICATIONS

Aasen et al., "Milestones toward Majorana-based quantum computing," *Phys. Rev. X*, vol. 6, 27 pp. (Apr. 2016).
(Continued)

*Primary Examiner* — Anh Q Tra
(74) *Attorney, Agent, or Firm* — Klarquist Sparkman, LLP

(57) ABSTRACT

Embodiments of the disclosed technology comprise methods and/or devices for performing measurements and/or manipulations of the collective state of a set of Majorana quasiparticles/Majorana zero modes (MZMs). Example methods/devices utilize the shift of the combined energy levels due to coupling multiple quantum systems (e.g., in a Stark-effect-like fashion). The example methods can be used for performing measurements of the collective topological charge or fermion parity of a group of MZMs (e.g., a pair of MZMs or a group of 4 MZMs). The example devices can be utilized in any system supporting MZMs.

17 Claims, 8 Drawing Sheets

(56) References Cited

U.S. PATENT DOCUMENTS

| | | |
|---|---|---|
| 9,256,834 B2 | 2/2016 | Bonderson et al. |
| 2012/0112168 A1 | 5/2012 | Bonderson et al. |
| 2014/0050475 A1 | 2/2014 | Bonderson et al. |
| 2014/0214257 A1* | 7/2014 | Williams ............... G05D 1/00 701/25 |
| 2014/0221059 A1* | 8/2014 | Freedman ............ H04W 99/00 455/899 |
| 2014/0279822 A1* | 9/2014 | Bonderson ............ G06N 10/00 706/62 |
| 2017/0141287 A1* | 5/2017 | Barkeshli ............ H01L 39/223 |
| 2018/0052806 A1 | 2/2018 | Hastings et al. |
| 2018/0053809 A1 | 2/2018 | Freedman et al. |

OTHER PUBLICATIONS

Alicea et al., "Non-Abelian Statistics and Topological Quantum Information Processing in 1D Wire Networks," *Nature Physics*, 23 pp. (Jun. 2010).

Bolech et al., "Observing Majorana Bound States in p-wave Superconductors Using Noise Measurements in Tunneling Experiments," *Journal of Physical Review Letters*, vol. 98, 4 pp. (Jun. 2007).

Bonderson, "Measurement-Only Topological Quantum Computation via Tunable Interactions," *Phys. Rev. B*, 10 pp. (Jan. 2013).

Bonderson et al., "Quasi-topological phases of matter and topological protection," *Physical Review B*, vol. 87, 27 pp. (Mar. 2013).

Bravyi et al., "Magic state distillation with low overhead," *Physical Review A*, vol. 86, 11 pp. (Sep. 2012).

Bravyi et al., "Universal quantum computation with ideal Clifford gates and noisy ancillas," *Physical Review A*, vol. 71, 15 pp. (Feb. 2005).

Chen et al., "Surface Plasmon Enhanced Sensitive Detection for Possible Signature of Majorana Fermions via a Hybrid Semiconductor Quantum Dot-Metal Nanoparticle System," *Journal of Scientific Reports*, vol. 5, 11 pp. (Aug. 2015).

Deng et al., "Parity independence of the zero-bias conductance peak in a nanowire based topological superconductor-quantum dot hybrid device," *Scientific Reports*, vol. 4, No. 1.

Domanski et al., "Constructive influence of the induced electron pairing on the Kondo state," *Journal of Scientific Reports*, vol. 6, 12 pp. (Mar. 2016).

Gottesman, "Theory of fault-tolerant quantum computation," *Physical Review A*, vol. 57, 30 pp. (Jan. 1998).

Huang et al., "Tunnel spectroscopy of Majorana bound states in topological superconductor-quantum dot Josephson junctions," *Physical Review B, Condensed Matter and Material Physics*, vol. 90, No. 21, 10 pp. (May 2015).

Hyart et al., "Flux-controlled quantum computation with Majorana fermions," *Phys. Rev. B*, vol. 88, 20 pp. (Jul. 2013).

International Search Report and Written Opinion dated Nov. 7, 2017, from International Patent Application No. PCT/US2017/047210, 18 pp.

Karzig et al., "A universal geometric path to a robust Majorana magic gate," *Physical Review X*, vol. 6, 14 pp. (Jul. 2016).

Karzig et al., "Scalable Designs for Quasiparticle-Poisoning-Protected Topological Quantum Computation with Majorana Zero Modes," *Physical Review B*, vol. 95, 32 pp. (Jun. 2017).

Karzig et al., "Scalable Designs for Quasiparticle-Poisoning-Protected Topological Quantum Computation with Majorana Zero Modes," arXiv:1610.05289, 34 pp. (Mar. 2017).

Klinovaja et al., "Electric-Field Induced Majorana Fermions in Armchair Carbon Nanotubes," Journal of Physical Review Letters, vol. 108, 5 pp. (May 2012).

Knill, "Quantum computing with realistically noisy devices," Nature, vol. 434, pp. 39-44 (Mar. 2005).

Landau et al., "Towards Realistic Implementations of a Majorana Surface Code," *Phys. Rev. Letters*, vol. 116, No. 5, 6 pp. (Feb. 2016).

Lee et al., "Electrical manipulation of Majorana fermions in an interdigitated superconductor-ferromagnet device," *Journal of Physical Review Letters*, vol. 109, 5 pp. (Sep. 2012).

Maier et al., "Majorana fermions in Ge/Si hole nanowires," *Journal of Physical Review B*, vol. 90, 11 pp. (Nov. 2014).

Mourik et al., "Signatures of Majorana fermions in hybrid superconductor-semiconductor nanowire devices," *Journal of Science*, vol. 336, No. 6084, 28 pp. (May 2012).

Nijholt et al., "Orbital effect of magnetic field on the Majorana phase diagram," *Physical Review B*, vol. 93, 6 pp. (Jun. 2016).

Pientka et al., "Signatures of topological phase transitions in mesoscopic superconducting rings," *New Journal of Physics*, vol. 15, 14 pp. (Feb. 2013).

Plugge et al., "Roadmap to Majorana surface codes," *Phys. Rev. B*, vol. 94, 23 pp. (Jun. 2016).

Preskill, "Lecture Notes for Ph219/CS219: Quantum Information and Computation—Chapter 5," 56 pp. (Jul. 2015).

Romero Lopes et al., "Algebraic treatment of the Stark effect for hydrogen," *Journal of Nuovo Cimento B*, vol. 3, Issue 23, 1 pp. (May 1971) (Summary only).

Smirnov, "Nonequilibrium Majorana fluctuations," *Journal of Mesoscale and Nanoscale Physics*, 5 pp. (Aug. 2016).

Vuik et al., "Effects of the electrostatic environment on the Majorana nanowire devices," *New Journal of Physics*, vol. 18, 15 pp. (Mar. 2016).

Mizushima et al., "Symmetry-Protected Topological Superfluids and Superconductors—From the Basics to $^3$He," YITP-15-67, pp. 1-82 (Jan. 2016).

Schneiderman et al., "Quasiparticle Poisoning in a Single Cooper-Pair Box," *AIP Conf. Proc.*, vol. 850, 2 pp. (Sep. 2006).

Final Office Action dated Nov. 8, 2018, from U.S. Appl. No. 15/636,457, 10 pp.

International Search Report and Written Opinion dated Nov. 20, 2017, from International Patent Application No. PCT/US2017/047417, 19 pp.

International Search Report and Written Opinion dated Nov. 13, 2017, from International Patent Application No. PCT/US2017/047418, 20 pp.

Kubica et al., "Universal transversal gates with color codes: A simplified approach," Physical Review A, vol. 91, No. 3, 12 pp. (Sep. 2014).

Office Action dated Mar. 30, 2018, from U.S. Appl. No. 15/636,457, 24 pp.

Xue, "Measurement based Controlled Not gate for topological qubits in a Majorana fermion quantum-dot hybrid system," *European Physical Journal*, vol. 67, No. 4, pp. 1-4 (Apr. 2013).

\* cited by examiner

MEASURING AND MANIPULATING STATES OF NON-ABELIAN QUASIPARTICLES VIA QUANTUM DOT HYBRIDIZATION ENERGY SHIFTS

CROSS REFERENCE TO RELATED APPLICATIONS

This application claims the benefit of U.S. Provisional Application No. 62/376,386, entitled "MEASURING AND MANIPULATING MAJORANA QUASIPARTICLE STATES USING THE STARK EFFECT" filed on Aug. 17, 2016, and U.S. Provisional Application No. 62/378,218, entitled "MEASURING AND MANIPULATING STATES OF NON-ABELIAN QUASIPARTICLES VIA QUANTUM DOT HYBRIDIZATION ENERGY SHIFTS" filed on Aug. 23, 2016, both of which are hereby incorporated herein by reference in their entirety.

FIELD

This application relates generally to quantum computers. More specifically, the application concerns topologically protected quantum circuits and techniques for measuring and manipulating quasiparticles and states in such circuits.

SUMMARY

Embodiments of the disclosed technology comprise methods and/or devices for performing measurements and/or manipulations of the collective state of a set of Majorana quasiparticles/Majorana zero modes (MZMs). Example methods/devices utilize the shift of the combined energy levels due to coupling multiple quantum systems (e.g., in a Stark-effect-like fashion). The example methods can be used for performing measurements of the collective topological charge or fermion parity of a group of MZMs (e.g., a pair of MZMs or a group of 4 MZMs). The example devices can be utilized in any system supporting MZMs. In certain desirable embodiments, the technology is used in nanowire realizations of MZMs; accordingly, the disclosure and figures will reflect this focus though it should be understood that the disclosed technology is more generally applicable.

DETAILED DESCRIPTION

I. General Considerations

Figure 1:
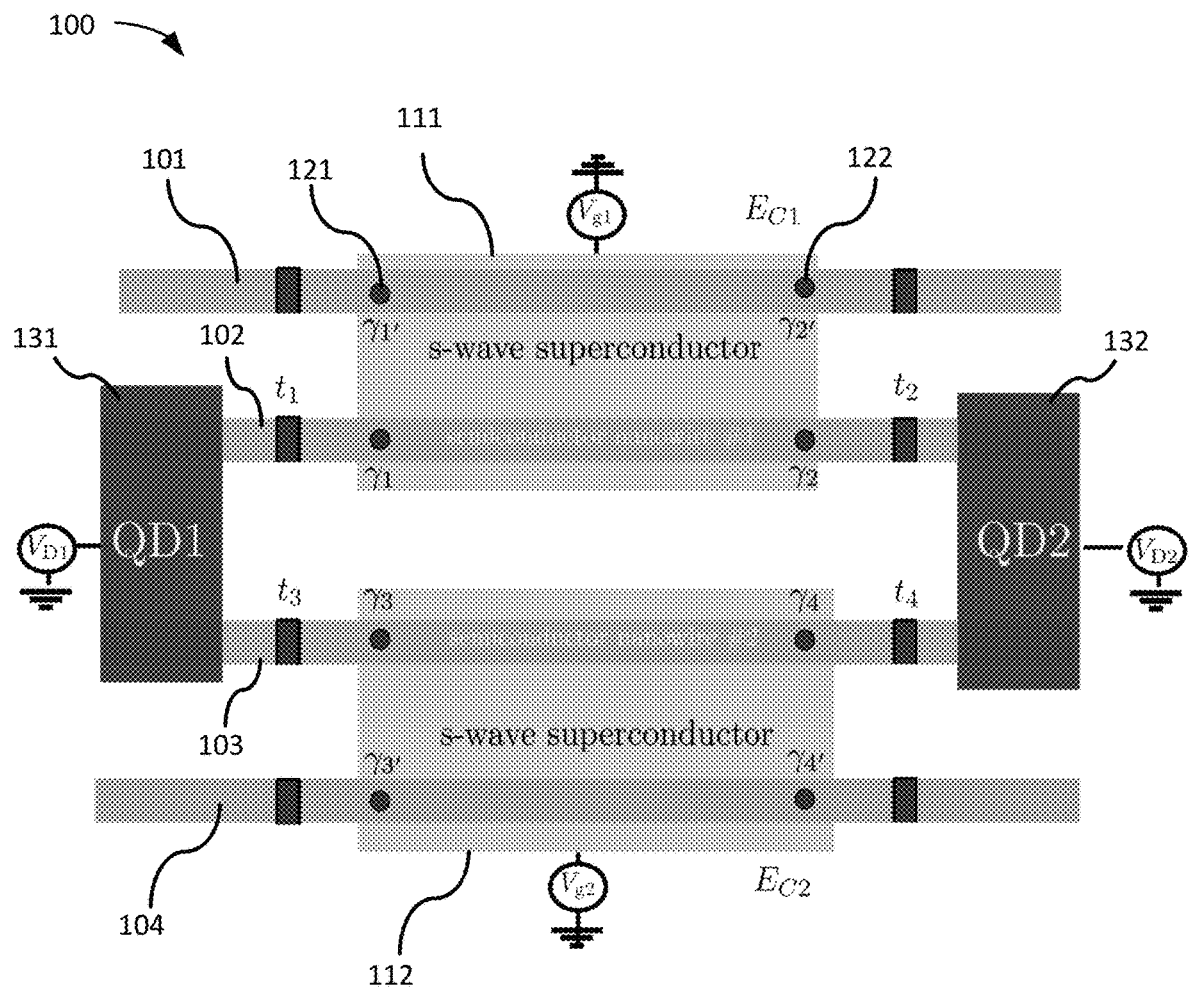
FIG. 1 is a schematic block diagram of a quantum device in accordance with embodiments of the disclosed technology.

Disclosed herein are representative embodiments of methods, apparatus, and systems for topological quantum devices, and in particular for topological quantum computers. The disclosed methods, apparatus, and systems should not be construed as limiting in any way. Instead, the present disclosure is directed toward all novel and nonobvious features and aspects of the various disclosed embodiments, alone or in various combinations and subcombinations with one another. Furthermore, any features or aspects of the disclosed embodiments can be used alone or in various combinations and subcombinations with one another. For example, one or more method acts from one embodiment can be used with one or more method acts from another embodiment and vice versa. The disclosed methods, apparatus, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Various alternatives to the examples described herein are possible. For example, some of the methods described herein can be altered by changing the ordering of the method acts described, by splitting, repeating, or omitting certain method acts, etc. The various aspects of the disclosed technology can be used in combination or separately. Different embodiments use one or more of the described innovations. Some of the innovations described herein address one or more of the problems noted herein. Typically, a given technique/tool does not solve all such problems.

As used in this application and in the claims, the singular forms "a," "an," and "the" include the plural forms unless the context clearly dictates otherwise. Additionally, the term "includes" means "comprises." Further, as used herein, the term "and/or" means any one item or combination of any items in the phrase.

II. Overview of Disclosed Technology

Embodiments of the disclosed technology comprise methods and/or devices for performing measurements and/or manipulations of the collective state of a set of Majorana quasiparticles/Majorana zero modes (MZMs). Example methods/devices utilize the shift of the combined energy levels due to coupling multiple quantum systems (e.g., in a Stark-effect-like fashion).

The example methods can be used to perform measurements of the collective topological charge or fermion parity of a group of MZMs (e.g., a pair of MZMs or a group of 4 MZMs). The example devices can be utilized in any system supporting MZMs. In certain desirable embodiments, the technology is used in nanowire realizations of MZMs; accordingly, the disclosure and figures will reflect this focus though it should be understood that the disclosed technology is more generally applicable. The disclosed technology can also be used in two-dimensional realizations of Majorana nanowires, such as those described in J. Shabani et al., "Two-dimensional epitaxial superconductor-semiconductor heterostructures: A platform for topological superconducting networks," Phys. Rev. B 93, 155402 (2016)

One example method described in this application is compatible with methods that utilize charging energy to protect subsystems of MZMs from quasiparticle poisoning and methods that utilize parallel nanowire (avoiding issues regarding alignment with the magnetic field, which arise for example in T-junction geometry, as in Phys. Rev. B 88, 035121 (2013)), arXiv:1511.01127, and H. Suominen et al., "Scalable Majorana Devices," arXiv:1703.03699.

The measurement apparatus of certain embodiments described in this application can also be utilized to generate "magic states" that are not topologically protected and other states and operations beyond those that can be obtained using Clifford gates. This generally involves precise calibration and tuning (time-dependent) profiles of gates and couplings/tunneling amplitudes.

In one exemplary embodiment, the device comprises: superconducting islands hosting MZMs (e.g., using Majorana nanowires that are proximitized with the superconductor); quantum dots; gates that control (among other things) charge of superconducting islands, charge of quantum dots, and tunneling couplings between the quantum dots and the MZMs. Further embodiments include devices that can perform measurements of the system energy (e.g., resonators for reflectometry measurements of the quantum dots). In particular embodiments, turning on couplings between the quantum dots and MZMs induces an energy shift which is determined by state-dependent quantum charge fluctuations between two subsystems. Such an energy shift affects many observable quantities such as, for example, the charge of the quantum dots.

III. Measurement Process

In accordance with certain example embodiments, during times when a measurement is not being performed, the couplings (tunneling amplitudes) $t_j$ (j=1, ..., 4) between the quantum dots and the MZMs are turned off. These couplings can be controlled, for example, using pinch-off gates. The measurement of the collective state of MZMs is initiated by turning on the couplings between the quantum dots and the corresponding MZMs to be measured (e.g., by changing the gate voltage of the pinch-off gates). Once the couplings are turned on, the energy levels of the two quantum dots will be affected. In particular, there will be a coupling of the two quantum dots with each other that is mediated by the Majorana system, resulting in hybridization of the quantum states. The hybridization energy J depends on the joint parity p of the four MZMs involved. In general, $J=\alpha+\beta p$, with system-dependent constants $\alpha$ and $\beta$, $p=\gamma_1\gamma_2\gamma_3\gamma_4$. Measuring the hybridized states (e.g. by measuring the energy of the system) therefore measures the joint parity p of the MZMs.

The measurement of the hybridized states can be done by a suitable spectroscopy. One example of this is through the use of reflectometry. The idea is that a change in the hybridization changes the quantum capacitance of the double dot system, which is defined by the second derivative of the energy with respect to the gate voltages $V_{D1}$ or $V_{D2}$. In particular, when the system is tuned close to resonance of the two dots, the energy is very sensitive to changes in the gate voltage of one of the dots, making the system's quantum capacitance become appreciable. When sending an rf-signal through an inductor towards the gate (say $V_{D1}$), the corresponding LC circuit is changed through the quantum capacitance, which manifests in a change of the reflection of the rf-signal. The reflectometry measures this change in reflection. (See, e.g., Petersson et al, Nano Lett. 10, 2789 (2010); Colless et al, Phys. Rev. Lett. 110, 46805 (2013)). Since the quantum capacitance depends on the hybridization J and, therefore, on the joint parity p, the reflectometry performs the desired projective measurement.

After the measurement of the hybridized states is performed, the couplings are turned off again. There is a small probability that the occupancy of the quantum dots will be different when the tunneling amplitudes are turned off at the end of the process described in the previous paragraph. This probability is suppressed by the charging energy, but it is not zero.

Various example methods may potentially be employed to minimize this probability of having the undesired quantum dot occupancy state (e.g., one could optimize the gate tuning profile controlling the couplings). If the occupancy of the dots changes from the initial value, then quasiparticle poisoning has occurred. However, one can determine when this potential quasiparticle poisoning has occurred and one can correct for this occurrence. For this, one can detect whether or not the quasiparticle poisoning has occurred by performing a measurement of the charge of the (decoupled) quantum dots. To recover from such an error (when it occurs), one can repeat the process of the joint parity measurement of the 4 MZMs: for instance, one can turn on the same tunneling amplitudes between the quantum dots and the MZMs again, the hybridized states can be measured, the tunneling amplitudes can be turned off again, and then the occupancy of the dots can be measured to once again detect whether the system is in the desired state. If the occupancy of the dots returns to its initial value, then the process is complete; otherwise, the procedure can be repeated until it succeeds.

The scheme can be readily generalized to a measurement of the joint parities of any even number of MZMs. For a measurement of 2 MZMs, say $\gamma_1$ and $\gamma_2$, one would need to have a simple coupling of an ancillary pair of MZMs, $\gamma_3$ and $\gamma_4$, which have a fixed joint parity $i\gamma_3\gamma_4$ of known value. This can be induced by a coupling of $\gamma_3$ and $\gamma_4$ or by a charging energy. The measurement of $p=-\gamma_1\gamma_2\gamma_3\gamma_4$ then is equivalent to a measurement of the parity $i\gamma_1\gamma_2$. The coupled ancillary pair of MZMs and the two described quantum dots can also be combined into a single quantum dot. For joint parity measurement of 6 or more MZMs, the measurements can be performed similar to the presented scheme for measuring the joint parity of 4 MZMs by adding additional Majorana islands with finite charging energy (light blue regions labeled as "s-wave superconductor" in FIG. 1). For example a setup for a measurement of the collective state of 8 MZMs could be realized by doubling the distance of the dots and adding two more islands in between.

IV. Utility for Quantum Computing

The utility of example embodiments of the disclosed technology for quantum computation can be summarized as follows:

Measurements of the state (topological charge or parity) of pairs of MZMs can generate all the topologically protected braiding operations. Further details on this topic can be found, for example, in U.S. Pat. No. 8,209,279: "Measurement-Only Topological Quantum Computation" and papers Phys. Rev. Lett. 101, 010501 (2008) [arXiv: 0802.0279] and Annals Phys. 324, 787-826 (2009) [arXiv: 0808.1933].

It is known that, for MZMs, braiding operations alone generates a proper subset of the Clifford operations. For example, in the "standard encoding" of qubits, braiding of MZMs only generates the 1-qubit Clifford gates. It is also known that supplementing braiding operations with the ability to perform measurements of the state (joint parity) of 4 MZMs allows one to generate the full set of Clifford gates with topological protection. For example, measurement of 4 MZMs allows one to change between distinct encodings of qubits and denser encodings allow one to obtain 2-qubit entangling gates. Further details in this regard can be found in U.S. Pat. No. 8,620,855: "Use of Topological Charge Measurements to Change Between Different Qubit Encodings."

It is known that the Clifford gates by themselves do not form a computationally universal gate set, but that supplementing the Clifford gates with a non-Clifford 1-qubit gate, e.g. the $\pi/8$-phase gate yields a computationally universal gate set. Such a gate can be produced from "magic states" by using measurements. Magic states can be generated in a number of ways for Majorana systems. The measurement apparatus described in this application can be used to generate magic states. (These magic states will not be topologically protected, so they will likely require some error-correction, e.g. by magic state distillation methods of Phys. Rev. A 71, 022316 (2005) [quant-ph/0403025]. If desired, one can also utilize cancellation schemes, such as those detailed in Phys. Rev. X 6, 31019 (2016)[arXiv: 1511.05161] to improve the fidelity of magic state generation, before distillation.) Methods of generating magic states with example embodiments of the described apparatus include the partial interferometry methods detailed in U.S. Pat. No. 9,256,834: "Quantum Computers Having Partial Interferometric Quantum Gates" and the following discussion of performing measurements of non-Pauli operators.

In the language of the encoded qubits, the parity measurements described above correspond to projections onto eigenstates of the Pauli operators or tensor products of Pauli operators (for multi-qubit measurements). The measurement scheme can be extended to measure superpositions of Pauli operators. For example, instead of projecting onto the X or Y Pauli operator one could project onto $P(\phi)=\cos(\phi)X \sin(\phi)Y$. This can be implemented, for example, by having another MZM $\gamma_0$ from the upper island that is coupled to the quantum dot. The measurement of the dot hybridization then has the effect of measurement of the MZMs' state corresponding to (approximate) projections onto the eigenstates of $(\cos(\phi)\gamma_0+\sin(\phi)\gamma_1)\gamma_2\gamma_3\gamma_4$. Fixing the parity of $\gamma_3$ and $\gamma_4$ (as previously discussed) will then equate this measurement with the desired measurement with respect to the eigenstates of $P(\phi)$. With $\phi=\pi/4$, this scheme would project onto a magic state. An exact projection is typically achieved through some fine tuning, so experimental implementations of this measurement scheme will generally have errors that are not topologically protected.

V. Summary of Joint Parity Measurement Through the Quantum Dot Energy Shift

The Hamiltonian for the superconducting island j is given by $$H_{Cj}=E_{Cj}(Q_j-Q_{0,j})^2+H_{BCS}$$

where $Q_{0,j}$ is controlled by the gate voltage $V_{gj}$ and $H_{BCS}$ is BCS Hamiltonian for the semiconductor-superconductor hybrid system. Further details of such systems can be found in Phys. Rev. Lett. 105, 077001 (2010) [arXiv:1002.4033] and Phys. Rev. Lett. 105, 177002 [arXiv:1003.1145]. The Hamiltonian for jth quantum dot (QD) reads $H_{QDj}=\Delta_j f_j^\dagger f_j$ with $\Delta_3$ being the energy splitting between even- and odd-charge states of the dot. Here $f_j^\dagger$ and $f_j$ are the creation and annihilation operators in the jth QD; $\Delta_j$ can be tuned using gate voltage $V_{QDj}$. The coupling between superconducting islands and QDs, in the low-energy approximation, acquires the following form (as described in Phys. Rev. Lett. 104, 056402 (2010)):

$$H = \sum_{j=1,3} t_j f_1^\dagger \gamma_j e^{-\phi_j/2} + \sum_{j=2,4} t_j f_2^\dagger \gamma_j e^{-\phi_j/2} + h.c.$$

where $\gamma_j$ is the self-conjugate Majorana operator, $t_j$ is the gate-tunable tunneling matrix element, and the operator $\phi_j$ is the conjugate operator to the island charge $Q_j$. Here, $\phi_1=\phi_2$ and $\phi_3=\phi_4$. The operator $e^{\mp i\Phi_j/2}$ increases/decreases the charge of the superconducting island by one electron. In the limit $E_{Cj}\gg|t_j|$, the charge on the islands is fixed by appropriately choosing the gate voltage $V_{gj}$. Henceforth, it is assumed that $Q_{0,1}=Q_{0,2}=0$. In this case, the fluctuations of charge occur due to virtual exchange of electrons between the islands and QDs. In the spirit of the second-order perturbation theory, one can derive an effective low-energy Hamiltonian valid at the energy scale much smaller than $E_{Cj}$. Henceforth, it is assumed, for simplicity, that $E_{C1}=E_{C2}=E_C$. After the projection to the low-energy subspace, one finds $$H = -\frac{|t_1|^2+|t_3|^2}{2E_C}f_1^\dagger f_1 - \frac{|t_2|^2+|t_4|^2}{2E_C}f_2^\dagger f_2 + \frac{i}{2}\left(\frac{t_1 t_2^*}{E_C}\hat{p}_1 + \frac{t_3 t_4^*}{E_C}\hat{p}_2\right)f_1^\dagger f_2 + h.c., \quad (1)$$

where $\hat{p}_1=i\gamma_1\gamma_2$ and $\hat{p}_2=i\gamma_3\gamma_4$. The spectrum of this Hamiltonian clearly depends on the joint parity $p=p_1 p_2$. Indeed, explicit calculation for $t_1=t_3=t_4=|t|$ and $t_2=|t|e^{i\alpha}$ yields the following eigenvalues for the system:

$$E_\pm = -\frac{2|t|^2}{E_C} \pm \frac{|t|^2}{E_C}\sqrt{2+2p\cos\alpha}. \quad (2)$$

(The – energies correspond to the ground state and + to the excited state.) Thus, the measurement of the QD energy shift constitutes a joint parity measurement $p=-\gamma_1\gamma_2\gamma_3\gamma_4$. Further, more general, results are presented in T. Karzig et al., "Scalable Designs for Quasiparticle-Poisoning-Protected Topological Quantum Computation with Majorana Zero Modes," arXiv:1610.05289 (March 2017) and T. Karzig et al., "Scalable Designs for Quasiparticle-Poisoning-Protected Topological Quantum Computation with Majorana Zero Modes," Phys. Rev. B 95, 235305 (2017).

VI. Example Implementations

In this section, an example joint parity measurement scheme using Quantum Dots (QDs) is described with further technical detail. As will be explained, the coupling of the superconducting islands to QDs leads to a measurable shift of the energy levels due to the quantum charge fluctuations between two subsystems. It is further demonstrated that the effective low-energy Hamiltonian for the device such as that pictured in FIG. 1 depends on the combined parity $\hat{P}=-\gamma_1\gamma_2\gamma_3\gamma_4$ when coupled to two quantum dots on both ends. By measuring the energy levels of the quantum dots, one can infer the eigenvalue of $\hat{P}$, an essential operation for Majorana-based topological quantum computing.

A. Overview of Example Scheme

Consider the device shown in schematic block diagram 100 of FIG. 1. In FIG. 1, superconducting islands 111, 112 correspond to s-wave superconductors with the corresponding SC phases $\phi_{1/2}$. Lines 101, 102, 103, 104 denote semiconducting nanowires proximitized by the superconductor. An in plane magnetic field allows one to tune the nanowire into a topological superconducting state with Majorana zero-energy modes at the opposite ends (shown as circles, such as circles 121, 122). Islands 131, 132 correspond to quantum dots which are coupled to the Majorana zero modes via gate-controlled barriers $t_j$. The charge on the islands and QDs can be tuned by the corresponding gate voltage $V_j$.

In FIG. 1, superconducting islands 111, 112 host two (or more) semiconducting nanowires. The nanowires are tuned to the topological phase by adjusting the chemical potential and magnetic field so that the nanowire hosts a Majorana zero mode (MZM) per end. See R. M. Lutchyn, J. D. Sau, and S. Das Sarma, Phys. Rev. Lett. 105, 077001 (2010); Y. Oreg, G. Refael, and F. von Oppen, Phys. Rev. Lett. 105, 177002 (2010). The nanowires labeled #1 (101) and #2 (102) are coupled to the quantum dots 1 (131) and 2 (132) at either end. Each superconducting island has appreciable charging energy $E_{C,j}=e^2/2C_{\Sigma j}$, determined by the geometrical capacitance $C_{\Sigma j}$ of the island (including the nanowires) to all other electrodes. The charge on the superconducting islands can be controlled by the gate voltage $V_{gj}$ (which determines the induced charge $Q_{gj}$). Therefore, the topological qubit comprising of superconducting islands is protected from unwanted quasiparticle tunneling (quasiparticle poisoning) by the charging energy. Indeed, at low temperature $T \ll E_C$, the probability of an excited state with an electron on the island is exponentially small ($\alpha \exp(-E_C/T)$) and electron excursions to the island are only allowed for a short period of time determined by the quantum uncertainty principle $\tau \sim \hbar/E_C$. These quantum fluctuations are state dependent and, therefore, contain information about the state of a topological qubit.

B. Theoretical Model

This subsection describes the theoretical model for the example scheme. The Hamiltonian for the superconducting island hosting semiconductor nanowires is given by $$H_0 = \sum_{j=1,2} H_{BCS,j} + H_{C,j} \quad (3)$$

where $H_{BCS,j}$ is the mean-field BCS Hamiltonian for the s-wave superconductor coupled to the nanowires. Due to the mesoscopic size of the island, there is a significant charging energy associated with it. The corresponding Hamiltonian reads $$H_{C,j} = E_{C,j}(Q_{tot,j} - Q_{0,j})^2. \quad (4)$$

The operator $Q_{tot,j}$ counts the combined nanowire-superconductor charge, and the offset charge $Q_{0,j}$ is tuned by changing the voltage applied to a superconducting island. In the low-energy approximation, one can project the system to the low-energy subspace (e.g. $\varepsilon \ll \Delta_0$ with $\Delta_0$ being the bulk gap of an s-wave superconductor). In this limit, one can represent the island as a collection of Kitaev wires (see A. Y. Kitaev, Physics-Uspekhi 44, 131 (2001)) having the same SC phase $\phi$ for each island. At the special point (dimerized limit), the Hamiltonians for the Majorana wire #1 and #2 are given by $$H_1 = -\Delta_P \sum_{j=1}^{N-1} \left(c_j^\dagger - e^{i\phi_1} c_j\right)\left(c_{j+1} + e^{-i\phi_1} c_{j+1}^\dagger\right) \quad (5)$$

$$H_2 = -\Delta_P \sum_{j=1}^{N-1} \left(d_j^\dagger - e^{i\phi_2} d_j\right)\left(d_{j+1} + e^{-i\phi_2} d_{j+1}^\dagger\right)$$

In the above, $c, c^\dagger$ correspond to fermion operators in wire #1, while $d, d^\dagger$ are the fermion operators for wire #2. Here $\Delta_P$ is the induced p-wave gap. The superconducting phase of the top (bottom) wire is $\phi_1$ ($\phi_2$), and the operator $e^{i\phi_1}$ ($e^{i\phi_2}$) adds a Cooper pair to the top (bottom) island.

One can define operators that commute with $H_{1/2}$:

$$\Gamma_1^\dagger = c_1^\dagger + e^{i\phi_1} c_1$$

$$\Gamma_2^\dagger = i(c_N^\dagger - e^{i\phi_1} c_N)$$

$$\Gamma_3^\dagger = d_1^\dagger + e^{i\phi_2} d_1$$

$$\Gamma_4^\dagger = i(d_N^\dagger - e^{i\phi_2} d_N) \quad (6)$$

(see for example:

$$[H_c, \Gamma_1^\dagger] = -\Delta\left[\left(c_1^\dagger - e^{i\phi_1} c_1\right)\left(c_2 + e^{-i\phi_1} c_2^\dagger\right), c_1^\dagger + e^{i\phi_1} c_1\right] \quad (7)$$

$$= -\Delta\left(\left(c_1^\dagger - e^{i\phi_1} c_1\right)\left[c_2 + e^{-i\phi_1} c_2^\dagger, c_1^\dagger + e^{i\phi_1} c_1\right] + \left[c_1^\dagger - e^{i\phi_1} c_1, c_1^\dagger + e^{i\phi_1} c_1\right]\left(c_2 + e^{-i\phi_2} c_2^\dagger\right)\right)$$

$$= \Delta\{c_1^\dagger - e^{i\phi_1} c_1, c_1^\dagger + e^{i\phi_1} c_1\}\left(c_2 + e^{-i\phi_1} c_2^\dagger\right)$$

$$= \Delta(-e^{i\phi_1} + e^{i\phi_1})\left(c_2 + e^{-i\phi_1} c_2^\dagger\right) = 0).$$

The operator $\Gamma_{1/2}^\dagger$ adds a charge to the island hosting wire #1, while $\Gamma_{3/4}^\dagger$ adds a charge to the island hosting wire #2. Thus, $\Gamma_i^\dagger$ does not commute with the number-conserving Hamiltonian $H_{C,1/2}$. However, the charge-neutral combination $$\Gamma_1^\dagger \Gamma_2 = e^{-i\phi_1} \Gamma_1^\dagger \Gamma_2^\dagger = i(e^{i\phi_1} c_1^\dagger c_N^\dagger - e^{i\phi_1} c_1 c_N + c_1 c_N^\dagger - c_1^\dagger c_N) \quad (8)$$

does commute with $Q_{tot,1}$ (and similarly for $\Gamma_3^\dagger \Gamma_4$ and $Q_{tot,2}$). Furthermore, as $i\Gamma_1^\dagger \Gamma_2$ squares to one and anticommutes with $\Gamma_{1/2}$, it counts the parity of wire #1. Similarly, $i\Gamma_3^\dagger\Gamma_4$ counts the parity of wire #2. We denote these operators by $$\hat{p}_1 = i\Gamma_1^\dagger\Gamma_2 \hat{p}_2 = i\Gamma_3^\dagger\Gamma_4. \qquad (9)$$

Finally, note that $\gamma_i = e^{-i\Phi_i/2}\Gamma_i^\dagger = \gamma_i^\dagger$ are the usual Majorana operators.

The eigenstates of $H_0$ have well defined total charge (wire plus superconductor) and parity for each island. Assume that $Q_{0,1/2}$ is adjusted such that the ground state has total charges $Q_1$ and $Q_2$. The five lowest energy states are given by)

$|0\rangle = |Q_1, Q_2; p_1 = p_1', p_2 \pm p_2'\rangle$ $|1\rangle = |Q_1+1, Q_2; -p_1, p_2\rangle = \Gamma_1^\dagger|0\rangle$ $|2\rangle = |Q_1-1, Q_2; -p_1, p_2\rangle = \Gamma_1|0\rangle$ $|3\rangle = |Q_1, Q_2+1; p_1, p_2\rangle = \Gamma_3^\dagger|0\rangle$ $|4\rangle = |Q_1, Q_2+1; p_1, -p_2\rangle = \Gamma_3|0\rangle.$ For the moment, one can denote the energy levels as $H_0|i\rangle = E_i|i\rangle$ One can rewrite the eigenstates in terms of the $\Gamma_{2/4}$ operators as follows:

$$-\hat{p}_1|1\rangle = (i\Gamma_1^\dagger\Gamma_2)|1\rangle = (i\Gamma_1^\dagger\Gamma_2)\Gamma_1^\dagger|0\rangle = \qquad (11)$$
$$-i\Gamma_1^\dagger\Gamma_1^\dagger\Gamma_2|0\rangle = -ie^{i\phi_1}\Gamma_2|0\rangle = -i\Gamma_2^\dagger|0\rangle \Rightarrow |1\rangle = ip_1\Gamma_2^\dagger|0\rangle$$

Similar manipulations imply $-p_1|2\rangle = i\Gamma_2|0\rangle \Rightarrow |2\rangle = ip_1\Gamma_2|0\rangle \qquad (12)$ $-p_2|3\rangle = i\Gamma_4^\dagger|0\rangle \Rightarrow |3\rangle = ip_2\Gamma_4^\dagger|0\rangle \qquad (13)$ $-p_2|4\rangle = i\Gamma_4|0\rangle \Rightarrow |4\rangle = ip_2\Gamma_4|0\rangle \qquad (14)$ Now add quantum dot Hamiltonian and the coupling between the QDs and the ends of the nanowires (i.e. the tunneling Hamiltonian):

$$H_{dots} = \sum_{i=1,2} \epsilon_i \left(f_i^\dagger f_i - \delta_{dot,i}\right)^2 \qquad (15)$$

$$H_{tunn} = -\left(t_1 f_1^\dagger c_1 + t_2 f_2^\dagger c_N + t_3 f_1^\dagger d_1 + t_4 f_2^\dagger d_N + h.c.\right) \qquad (16)$$

The operators $f_i$, $f_i^\dagger$ annihilate and create fermions in the left and right quantum dots. $\epsilon_i$ are the charging energies of the QDs and $\delta_{dot,i}$ are the offset charges which we restrict to the interval $\delta_{dot,i} \in (0, 1)$ so that the relevant charge states are either $|0\rangle_{QD}$ or $|1\rangle_{QD}$. Thus, a basis for the quantum dot degrees of freedom is $|0\rangle_{QD} = |n_1 = 0, n_2 = 0\rangle$ $|1\rangle_{QD} = |n_1 = 1, n_2 = 0\rangle = f_1^\dagger|0\rangle_{QD}$ $|2\rangle_{QD} = |n_1 = 0, n_2 = 1\rangle = f_2^\dagger|0\rangle_{QD}$ $|3\rangle_{QD} = |n_1 = 1, n_2 = 1\rangle = f_1^\dagger f_2^\dagger|0\rangle_{QD}. \qquad (17)$ It is desirable to rewrite $H_{tunn}$ in terms of the operators $\Gamma_i$, describing our low-energy subspace. This can be done using $$c_1 \rightarrow \frac{1}{2}\Gamma_1 \quad c_N \rightarrow \frac{i}{2}\Gamma_2 \quad d_1 \rightarrow \frac{1}{2}\Gamma_3 \quad d_N \rightarrow \frac{i}{2}\Gamma_4. \qquad (18)$$

After performing the projection described above, one can find the effective tunneling Hamiltonian:

$$H_{tunn}^{eff} = -\frac{1}{2}\left(t_1 f_1^\dagger \Gamma_1 + it_2 f_2^\dagger \Gamma_2 + t_3 f_1^\dagger \Gamma_3 + it_4 f_2^\dagger \Gamma_4 + h.c.\right). \qquad (19)$$

It is useful to establish what the non-zero matrix elements of the $\Gamma_i$ operators are. The basis defined in Eq. (10) is orthonormal, therefore the only non-zero matrix elements are $\langle 2|\Gamma_1|0\rangle = 1 \ \langle 0|\Gamma_1|1\rangle = 1 \qquad (20)$ $\langle 2|\Gamma_2|0\rangle = -ip_1 \ \langle 0|\Gamma_2|1\rangle = ip_1 \qquad (21)$ $\langle 4|\Gamma_3|0\rangle = 1 \ \langle 0|\Gamma_3|3\rangle = 1 \qquad (22)$ $\langle 4|\Gamma_4|0\rangle = -ip_2 \ \langle 0|\Gamma_4|3\rangle = ip_1 \qquad (23)$ along with their hermitian conjugates. Importantly, one sees that certain matrix elements depend on the parity eigenvalues $p_1$, $p_2$.

One can also solve for the non-zero matrix elements in the quantum dot basis for the $f_i$ operators:

$\langle 1|f_1^\dagger|0\rangle_{QD} = 1 \ \langle 3|f_1^\dagger|2\rangle_{QD} = 1$ $\langle 2|f_2^\dagger|0\rangle_{QD} = 1 \ \langle 3|f_2^\dagger|2\rangle_{QD} = -1$ plus hermitian conjugates.

One can now write the effective tunneling Hamiltonian for the system shown in FIG. 1 in this basis:

$$H_{tunn}^{eff} = -\frac{1}{2}\sum_{i,j} |i\rangle\langle i| \otimes |j\rangle\langle j|_{QD} \times \qquad (24)$$
$$\left(t_1 f_1^\dagger \Gamma_1 + it_2 f_2^\dagger \Gamma_2 + t_3 f_1^\dagger \Gamma_3 + it_4 f_2^\dagger \Gamma_4 + h.c.\right) \times$$
$$\sum_{i',j'} |i'\rangle\langle i'| \otimes |j'\rangle\langle j'|_{QD}$$
$$= -\frac{t_1}{2}(|2\rangle\langle 0| + |0\rangle\langle 1|) \otimes (|1\rangle\langle 0| + |3\rangle\langle 2|)_{QD} -$$
$$p_1 \frac{t_2}{2}(|2\rangle\langle 0| - |0\rangle\langle 1|) \otimes (|2\rangle\langle 0| - |3\rangle\langle 1|)_{QD} -$$
$$\frac{t_3}{2}(|4\rangle\langle 0| + |0\rangle\langle 3|) \otimes (|1\rangle\langle 0| + |3\rangle\langle 2|)_{QD} -$$
$$p_2 \frac{t_4}{2}(|4\rangle\langle 0| - |0\rangle\langle 3|) \otimes (|2\rangle\langle 0| - |3\rangle\langle 1|)_{QD} + h.c.$$

In the above basis, the quantum dot Hamiltonian can be written as $$H_{dots} = \mathbb{1} \otimes \sum_i E_{dots,i}|i\rangle\langle i|_{QD} \qquad (25)$$

while the superconducting island Hamiltonian is $$H_0 = \sum_i E_i|i\rangle\langle i| \otimes \mathbb{1}_{QD}. \qquad (26)$$

To be explicit, $E_0 = E_{C,1}(Q_1 - Q_{0,1})^2 + E_{C,2}(Q_2 - Q_{0,2})^2$ $E_1 = E_{C,1}(Q_1 + 1 - Q_{0,1})^2 + E_{C,2}(Q_2 - Q_{0,2})^2$ $$E_2 = E_{C,1}(Q_1-Q_{0,1})^2 + E_{C,2}(Q_2+1-Q_{0,2})^2$$

$$E_3 = E_{C,1}(Q_1-Q_{0,1})^2 + E_{C,2}(Q_2+1-Q_{0,2})^2$$

$$E_4 = E_{C,1}(Q_1-Q_{0,1})^2 + E_{C,2}(Q_2-1-Q_{0,2})^2 \quad (27)$$

$$E_{dots,0} = \epsilon_1 \delta_{dot,1}^2 + \epsilon_2 \delta_{dot,2}^2$$

$$E_{dots,1} = \epsilon_1 (1-\delta_{dot,1})^2 + \epsilon_2 \delta_{dot,2}^2$$

$$E_{dots,2} = \epsilon_1 \delta_{dot,1}^2 + \epsilon_2 (1-\delta_{dot,2})^2$$

$$E_{dots,3} = \epsilon_1 (1-\delta_{dot,1})^2 + \epsilon_2 (1-\delta_{dot,2})^2.$$

In this basis, the total Hamiltonian, $$H_{tot} = H_{tunn}^{eff} + H_{dots} + H_0, \quad (28)$$

is a 20×20 Hermitian matrix that can be numerically diagonalized. In the next section, the results of the numerical diagonalization are discussed.

C. Energy Shift Dependence on Joint Parity P

1. Symmetric Limit

First, one can solve for the eigenvalues of Eq. (28) in the symmetric limit where the superconducting islands have equal charging energies, $E_{C,1} = E_{C,2} = E_C$, the tunnel couplings on the left (right) dots are the same, $t_1 = t_3 = t_L$ and $t_2 = t_4 = t_R$, the dots are tuned to the degeneracy point $\delta_{dot,i} = 1/2$, and the offset charge on the islands has been tuned so that $Q_1 = Q_{0,1}$ and $Q_2 = Q_{0,2}$. The last assumption implies that $E_{i \neq 0} = E_C$ and $E_0 = 0$.

The four lowest eigenenergies of the full system are slightly shifted from zero due to the coupling between the quantum dots and the Majorana nanowires:

$$\varepsilon_0 = \varepsilon_1 = \frac{E_C}{2}\left(1 - \sqrt{1 + \frac{2}{E_C^2}(|t_L|^2 + 2|t_R|^2)}\right) \quad (29)$$

$$\varepsilon_2 = \frac{E_C}{2}\left(1 - \sqrt{1 + \frac{2}{E_C^2}(|t_L|^2 + |t_R|^2 + (1+p)|t_L||t_R|)}\right)$$

$$\varepsilon_3 = \frac{E_C}{2}\left(1 - \sqrt{1 + \frac{2}{E_C^2}(|t_L|^2 + |t_R|^2 - (1+p)|t_L||t_R|)}\right).$$

One may notice that the only parity dependence is on the product $p = p_1 p_2$. Thus, the measurement of the QD energy shift constitutes a joint parity measurement. However, this measurement does not allow one to determine the parity state of the individual wire #1 or wire #2. The lowest eigenvalues are consistent with the results presented above.

In the limit of weak tunneling $$\left(\text{i.e. } \frac{|t_{L/R}|}{E_C} \ll 1\right),$$

the leading order of perturbation theory yields $$\varepsilon_0 = \varepsilon_1 \approx -\frac{|t_L|^2 + |t_R|^2}{2E_C} \quad (30)$$

$$\varepsilon_2 \approx -\frac{|t_L|^2 + |t_R|^2 + (1+p)|t_L||t_R|}{2E_C}$$

$$\varepsilon_3 \approx -\frac{|t_L|^2 + |t_R|^2 - (1+p)|t_L||t_R|}{2E_C}$$

To lowest order in $|t_{L/R}|/E_C$, when the parities are opposite (p=−1) there are four degenerate ground state energies. When the parities are equal (p=+1) the degeneracy is split into three energy levels, one of which is degenerate. These degeneracies, however, are accidental and are due to the choice of parameters made. Once one considers the most general theory with different $t_j$ and $E_{Cj}$ the degeneracies will be lifted. In any case, the conclusion is that it is possible to determine from the low energy spectrum whether the combined parity, p, is even or odd. This difference in energy can be detected using the standard energy-level spectroscopy techniques (e.g. probing DoS in the QD).

In the discussion above, the focus has been on the specific point when $Q_{1/2} = Q_{0,1/2}$. This section will now investigate the spectrum away from this point and demonstrate that effect still persists (the energy of the full system still depends on the combined parity p). Let's define the detuning from this point as $Q_{1/2} = Q_{0,1/2} - \delta$, where $1 \gg \delta > 0$. The energies of $H_0$ are now give by $$E_0 = E_C \delta^2,$$

$$E_1 = E_3 = E_C(1-\delta)^2, \quad (31)$$

$$E_2 = E_4 = E_C(1 \pm \delta)^2.$$

The analytical expression is not illuminating so we present numerical results instead. The plots of the four lowest eigenenergies vs δ are shown in FIGS. 2 and 3.

Figure 2:
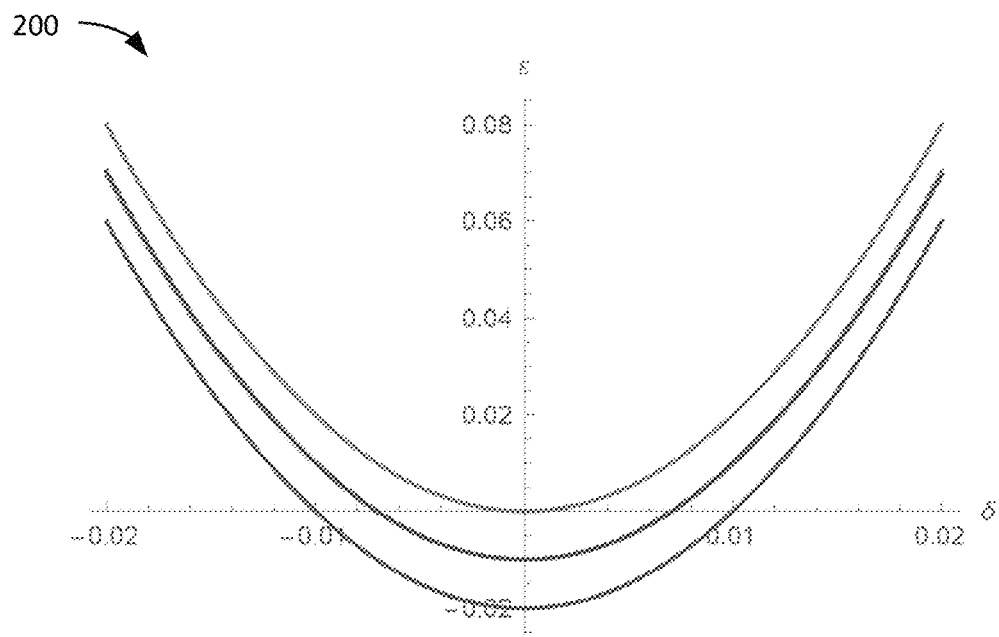
FIG. 2 is a graph showing the dependence of the four lowest energy eigenvalues (measured in units of t) vs. $\delta$ for the even parity ground state degeneracy splitting for an example configuration discussed herein.

FIG. 2 is a graph 200 showing the dependence of the four lowest energy eigenvalues (measured in units of t) vs. δ for the even parity ground state degeneracy splitting. Here $E_C=100$, $t_L=1$, $t_R=i$, and p=+1 (even parity). Note that at the degenerate point considered in the previous section, there are three distinct energies with the middle curve nearly two-fold degenerate (analogous to $\epsilon_{0/1}$ in the previous section).

Figure 3:
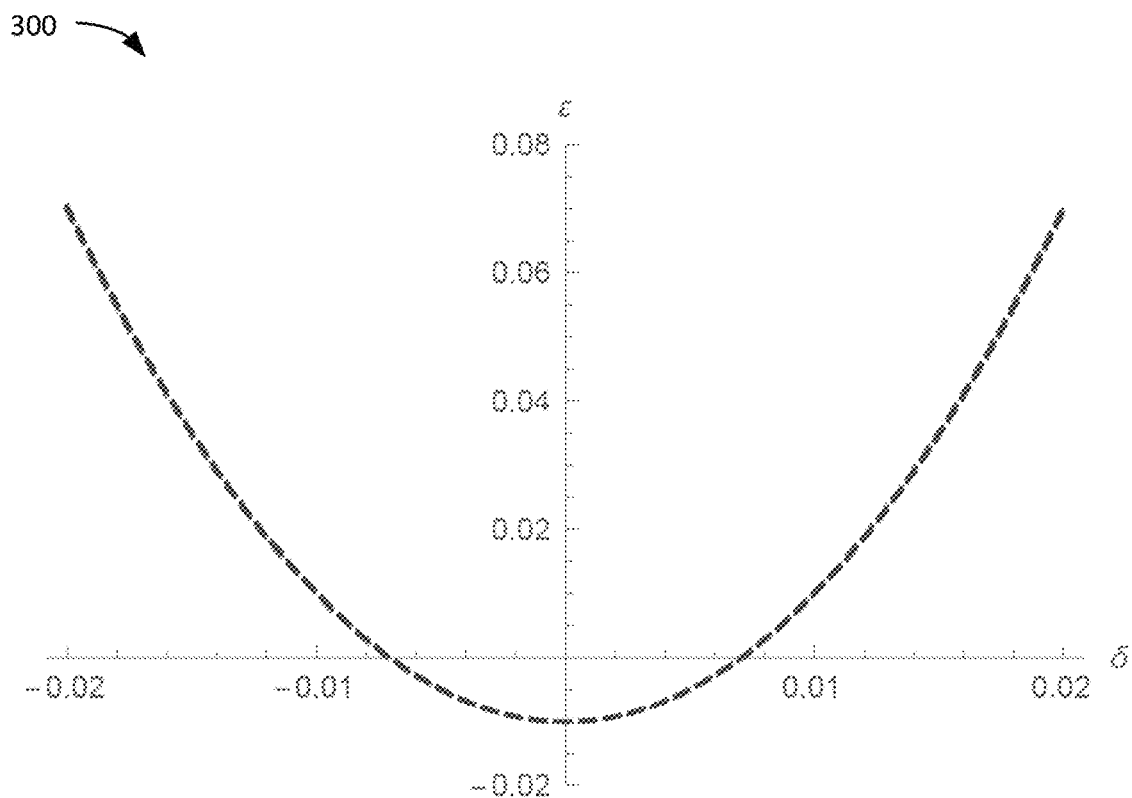
FIG. 3 is a graph showing the dependence of the four lowest energy eigenvalues (measured in units of t) vs. $\delta$ for the odd parity degenerate ground states for an example configuration discussed herein.

FIG. 3 is a graph 300 showing the dependence of the four lowest energy eigenvalues (measured in units of t) vs. δ for the odd parity degenerate ground states. Here the parameters are the same as in FIG. 2, but with p=−1 (odd parity). Notice that all four energies are nearly degenerate.

2. Quantum Dot Gate Voltage Dependence of the Energy Shift

Figure 4:
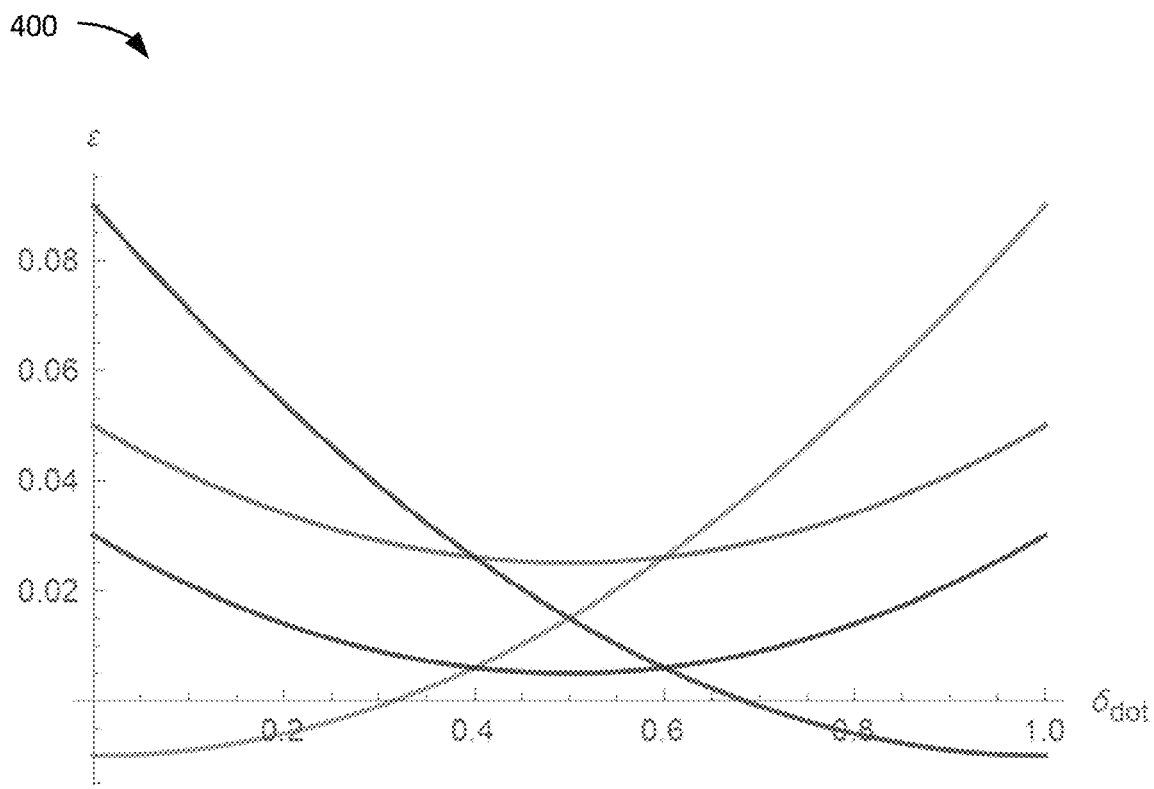
FIG. 4 is a graph showing the lowest eigenvalues as a function of the gate charge offset $\delta_{dot}$ for even joint parity for an example configuration discussed herein.
Figure 5:
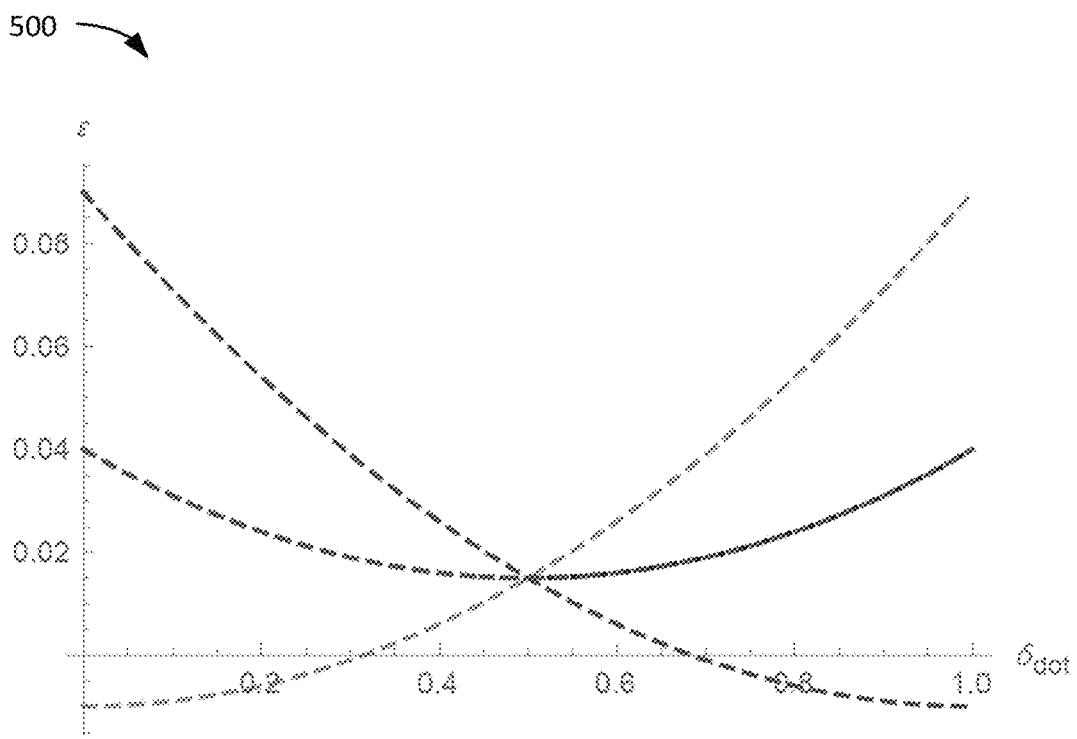
FIG. 5 is a graph showing the lowest eigenvalues as a function of the gate charge offset $\delta_{dot}$ for odd joint parity for an example configuration discussed herein.
Figure 6:
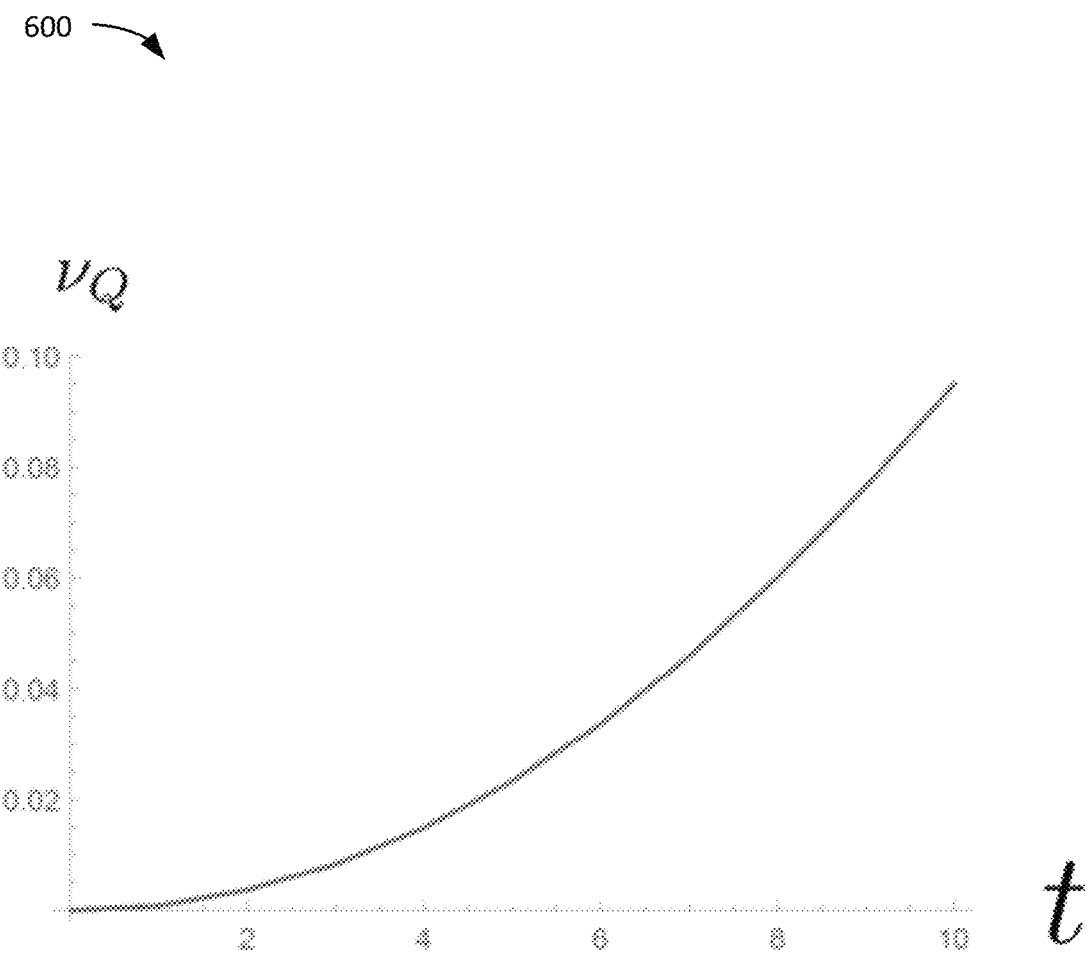
FIG. 6 is a graph showing the relative difference in quantum capacitances $v_2$ for even and odd joint parity states as a function of t for an example configuration discussed herein.

In addition to energy-level spectroscopy, it will now be demonstrated that quantum capacitance of the system depends on the joint parity p. Consider the case when QD1, for example, is capacitively coupled to an LC resonator. The impedance of the system depends on the capacitance of the QD which is sensitive to quantum charge fluctuations in the dot. Quantum capacitance of the system is defined as the curvature of the energy with respect to the offset charge on the dot.

$$C_Q^{-1} = \frac{1}{e^2} \frac{\partial^2 E_{GS}}{\partial^2 \delta_{dot}}, \quad (32)$$

where $E_{GS}$ is the ground-state energy of the system. The plots of the energy dependence on $\delta_{dot,1}$ for different parities are shown in FIGS. 4 and 5. As a measure of the QD capacitance change, consider the relative difference ν, defined as $$v_Q = \frac{C_Q(p=+1) - C_Q(p=-1)}{C_Q(p=+1) + C_Q(p=-1)} \quad (33)$$

and plot it as a function of $t_R=t_L=t$, see FIG. 6. Note that this method works for parameter regime when the ground-state energy is parity-dependent.

More specifically, FIG. 4 is a graph 400 showing the lowest eigenvalues as a function of the gate charge offset $\delta_{dot}$ for even joint parity. Here, the following parameters were used $\epsilon_1=\epsilon_2=0.05$, $t_L=1$, $t_R=I$, $E_C=100$, $\delta=0$, p=+1. FIG. 5 is a graph 500 showing the lowest eigenvalues as a function of the gate charge offset $\delta_{dot}$ for odd joint parity. Here, the following parameters were used $\epsilon_1=\epsilon_2=0.05$, $t_L=1$, $t_R=I$, $E_C=100$, $\delta=0$, p=−1. FIG. 6 is a graph 600 showing the relative difference in quantum capacitances $v_Q$ for even and odd joint parity states as a function of t. Here we used the following parameters: $\epsilon_1=\epsilon_2=500$, $t_L=10$, $t_R=10I$, $E_C=100$, $\delta=0$ and $\delta_{dot,1/2}=0.5$.

VII. General Embodiments

The disclosed technology can be used as a basic building block for a Majorana-based quantum computer that is protected from quasiparticle errors (e.g., quasiparticle poisoning) by the charging energy of the superconducting islands (e.g., $E_{Cj}$). Further, gate voltages $V_{gj}$ allow one to control the charge on the superconducting islands. The embodiments disclosed herein include example methods for measuring joint parity P of four Majorana zero modes (P=$\gamma_1\gamma_2\gamma_3\gamma_4$) using quantum dots (the quantum dot energy shift depends on the product of $\gamma_1\gamma_2\gamma_3\gamma_4$). Further, tunnel couplings $t_j$ are gate-tunable and, in certain embodiments, can be turned on or off on demand. Tunnel couplings $t_j$ and quantum dot gate voltages $V_{Dj}$ are used to decouple QDs from the topological qubit. The disclosed embodiments allow one to generate XX, ZZ, ZX and XZ spin couplings between the qubits.

As discussed and explained above, FIG. 1 is a schematic layout 100 of an example device for joint parity measurement. The layout 100 can be used to generate ZZ couplings. In the layout 100, by measuring the energy shift in the dot, one can perform a measurement of the joint fermion parity $\gamma_1\gamma_2\gamma_3\gamma_4$. Using the following encoding for fermion parities $p_1=i\gamma_1\gamma_2$, $p_1'=i\gamma_1\gamma_{2'}$, $p_2=i\gamma_3\gamma_4$, and $p_{2'}=i\gamma_3\gamma_{4'}$, the aforementioned measurement is equivalent to $Z_1Z_2$ spin coupling.

Figure 7:
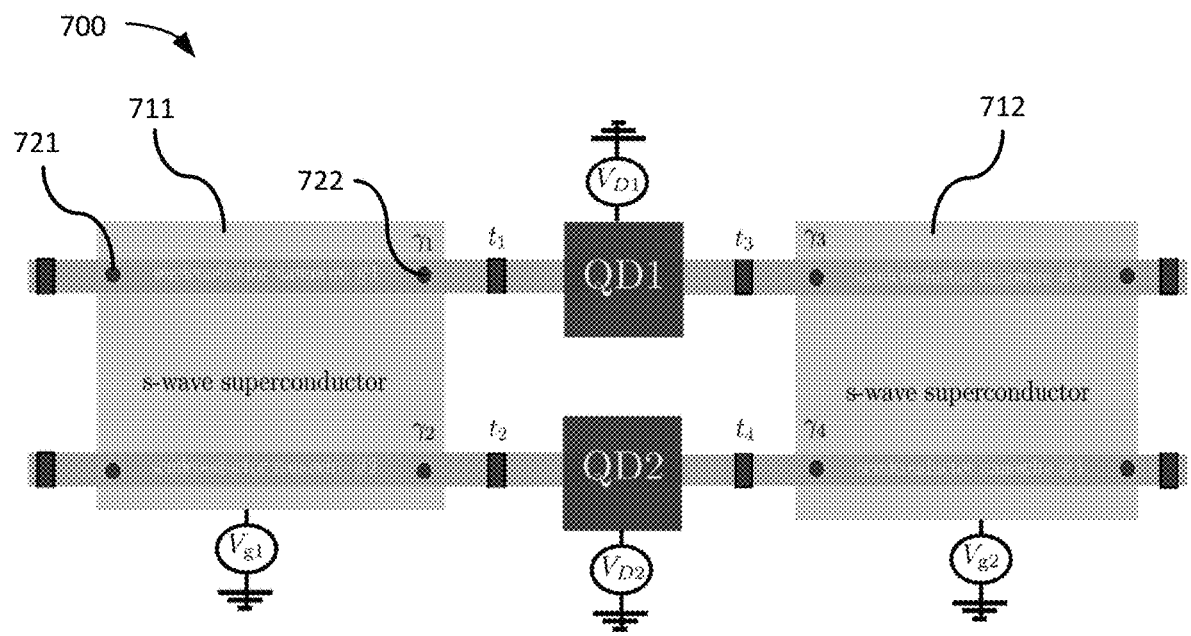
FIG. 7 is a schematic layout of another example device for joint parity measurement.

FIG. 7 is a schematic layout 700 of an example device for joint parity measurement. The layout 700 can be used to generate XX couplings. In the layout 700, superconducting islands 711 and 712 are characterized by the corresponding charging energies $E_{Cj}=(e^2)/(2C_{\Sigma j})$ with $C_{\Sigma j}$ being the geometric capacitance of the J-th island. Further, each island contains 4 Majorana zero modes (shown as circles, such as circles 721, 722). Quantum dots (QD1 and QD2) are assumed to have large charging energy as well. The charge on the islands and dots can be controlled via capacitively coupled gate electrodes. By measuring the energy shift in the dot, one can perform the measurement of the joint fermion parity $\gamma_1\gamma_2\gamma_3\gamma_4$. Using the following encoding for fermion parities $p_j=i\gamma_j\gamma_{j'}$ for j=1 . . . 4 (which defines the z-basis for qubits), the aforementioned measurement is equivalent to $X_1X_2$ spin coupling.

Figure 8:
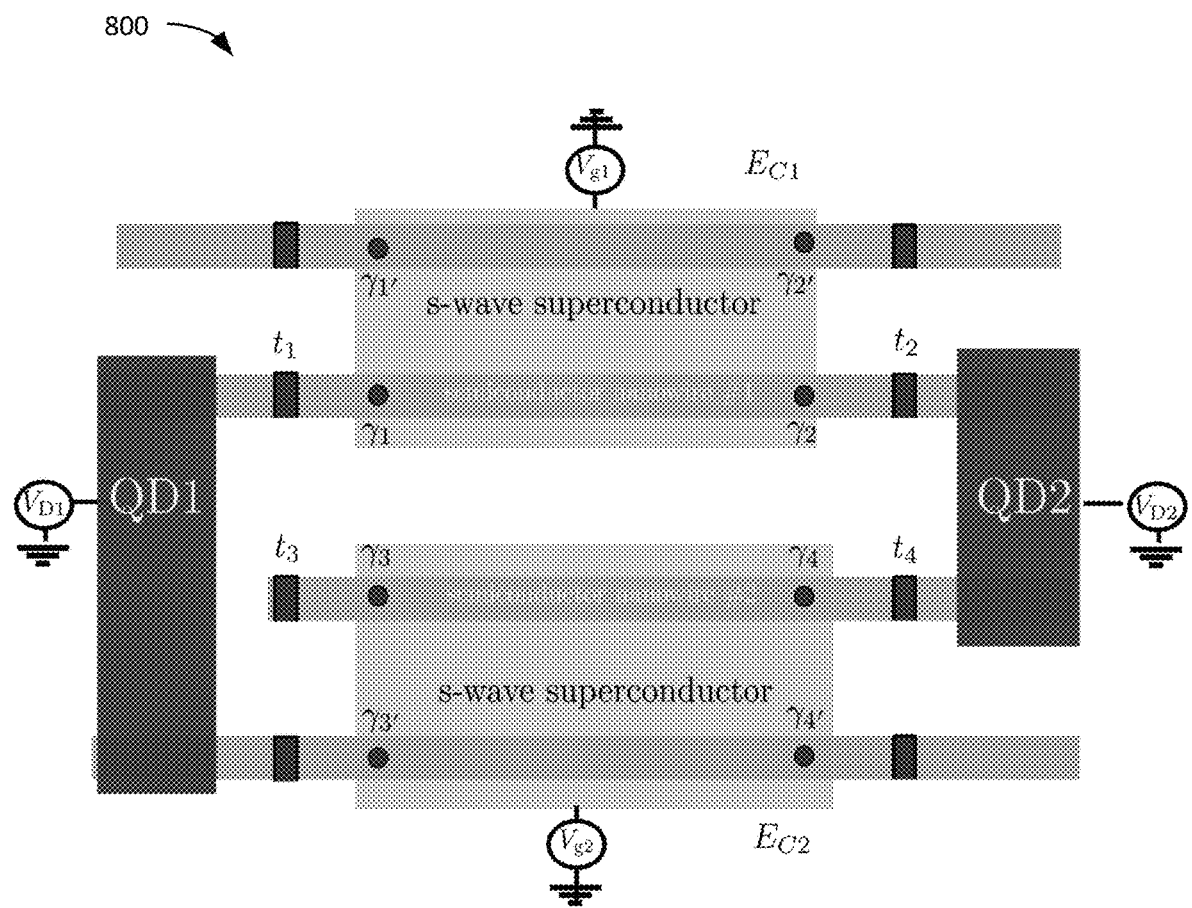
FIG. 8 is a schematic layout of yet another example device for joint parity measurement.

FIG. 8 is a schematic layout 800 of an example device for joint parity measurement. The layout 800 can be used to generate ZX couplings. By measuring the energy shift in the dot, one performs a measurement of the joint fermion parity $\gamma_1\gamma_2\gamma_3\gamma_4$. Using the following encoding for fermion parities $p_1=i\gamma_1\gamma_2$, $p_1'=i\gamma_1\gamma_{2'}$, $p_2=i\gamma_3\gamma_4$, and $p_{2'}=i\gamma_3\gamma_{4'}$, the aforementioned measurement is equivalent to $Z_1X_2$ spin coupling. Using a scheme, one can also generate $X_1Z_2$ spin coupling.

Figure 9:
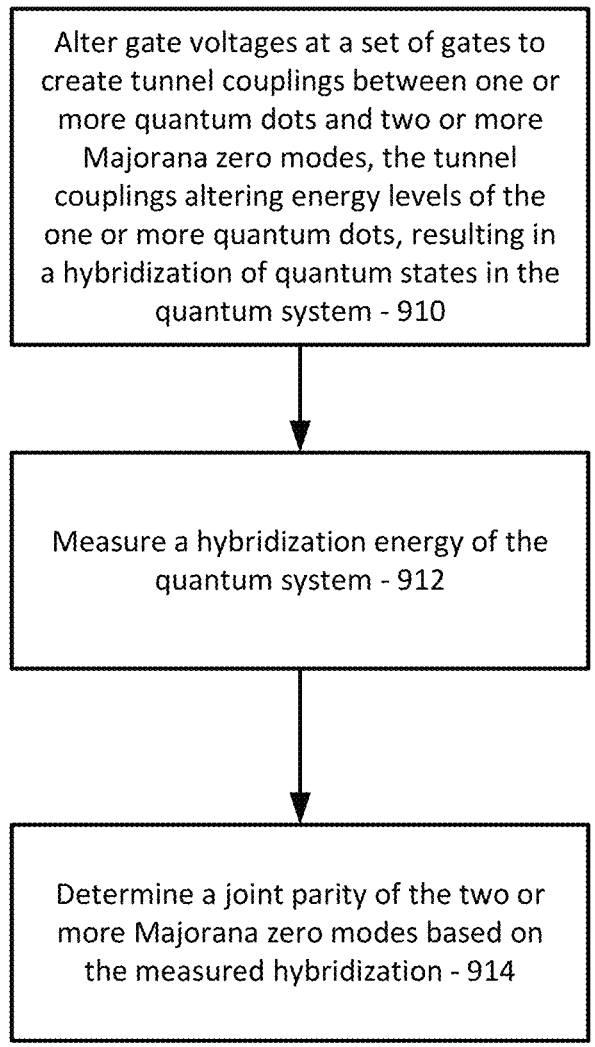
FIG. 9 is a flowchart for operating a quantum system in accordance with embodiments of the disclosed technology.

FIG. 9 is a flowchart 900 for operating a quantum system in accordance with embodiments of the disclosed technology. The illustrated embodiment should not be construed as limiting, as the disclosed method acts can, in some cases, be performed alone, in different orders, or at least partially simultaneously with one another. Further, any of the disclosed methods or method acts can be performed with any other methods or method acts disclosed herein.

At 910, gate voltages at a set of gates are altered to create tunnel couplings between one or more quantum dots and two or more Majorana zero modes, the tunnel couplings altering energy levels of the one or more quantum dots, resulting in a hybridization of quantum states in the quantum system.

At 912, a hybridization energy of the quantum system is measured.

At 914, a joint parity of the two or more Majorana zero modes is determined based on the measured hybridization.

In certain implementations, the method can further comprise altering the gate voltages at the set of gates to decouple the one or more quantum dots from the two or more Majorana zero modes. In some implementations, the method can further comprise measuring respective charges of the one or more quantum dots.

In certain implementations, the method further comprises using the joint parity to implement the full set of Clifford gates in a quantum computer. Still further, the two or more Majorana zero modes are part of a phase gate in a quantum computer.

In some implementations, the measuring is performed using spectroscopy. In certain implementations, the measuring is performed using a microwave resonator. In further implementations, the measuring is performed by measuring quantum capacitance.

Figure 10:
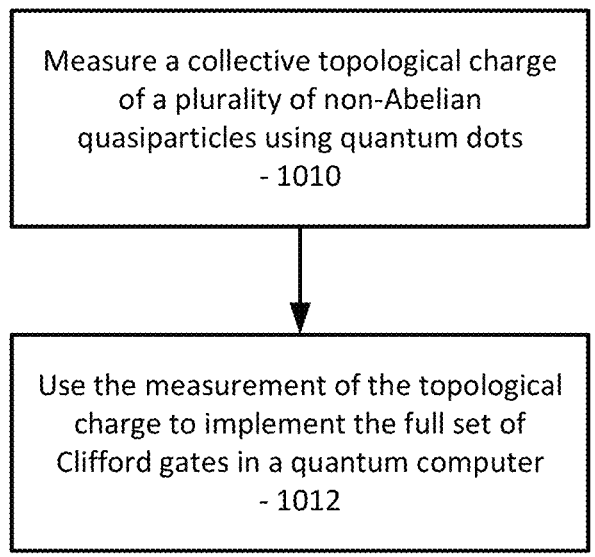
FIG. 10 is another flowchart for operating a quantum system in accordance with embodiments of the disclosed technology.

FIG. 10 is a flowchart 1000 for operating a quantum system in accordance with embodiments of the disclosed technology. The illustrated embodiment should not be construed as limiting, as the disclosed method acts can, in some cases, be performed alone, in different orders, or at least partially simultaneously with one another. Further, any of the disclosed methods or method acts can be performed with any other methods or method acts disclosed herein.

At 1010, a collective topological charge of a plurality of non-Abelian quasiparticles using quantum dots is measured. In particular implementations, the non-Abelian quasiparticles are Majorana zero modes. Further, the measuring can comprise measuring a joint parity P of the Majorana zero modes using the quantum dots, the joint parity being the product of the topological charge of the plurality of the Majorana zero modes.

At 1012, the measurement of the topological charge is used to implement the full set of Clifford gates in a quantum computer.

In some implementations, a first and a second of the Majorana zero modes are implemented on a first superconducting island, and a third and a fourth of the Majorana zero modes are implemented on a second superconducting island separate from the first superconducting island. Further, in certain implementations, the measuring is performed using spectroscopy. In some implementations, the measuring is performed using a microwave resonator. In further implementations, the measuring is performed by measuring quantum capacitance.

Also disclosed herein are embodiments of a quantum-dot-supported topological quantum device that is quasiparticle-poisoning-protected.

In particular example implementations, the quantum device comprises: a first superconducting island on which one or more first-island nanowires are located, the one or more first-island nanowires including a first first-island nanowire having a first end and a second end distal to the first end; a second superconducting island on which one or more second-island nanowires are located, the one or more second-island nanowires including a first second-island nanowire having a first end and a second end distal to the first end; a first quantum dot having a first tunable quantum-tunneling coupling to the first end of the first first-island nanowire and a second tunable quantum-tunneling coupling to the first end of the first second-island nanowire; and a second quantum dot having a third tunable quantum-tunneling coupling to the second end of the first first-island nanowire and a fourth tunable quantum-tunneling coupling to the second end of the first second-island nanowire.

In other example implementations, the quantum device comprises: a first superconducting island on which two or more first-island nanowires are located, the two or more first-island nanowires including a first first-island nanowire having a first end and a second end distal to the first end, and a second first-island nanowire having a first end and a second end distal to the first end; a second superconducting island on which two or more second-island nanowires are located, including a first second-island nanowire having a first end and a second end distal to the first end, and a second second-island nanowire having a first end and a second end distal to the first end; a first quantum dot having a first tunable quantum-tunneling coupling to the second end of the first first-island nanowire and a second tunable quantum-tunneling coupling to the first end of the first second-island nanowire; and a second quantum dot having a third tunable quantum-tunneling coupling to the second end of the second first-island nanowire and a fourth tunable quantum tunneling coupling to the first end of the second second-island nanowire.

In further example implementations, the quantum device comprises: a first superconducting island on which one or more first-island nanowires are located, the one or more first-island nanowires including a first first-island nanowire having a first end and a second end distal to the first end; a second superconducting island on which two or more second-island nanowires are located, including a first second-island nanowire having a first end and a second end distal to the first end, and a second second-island nanowire having a first end and a second end distal to the first end; a first quantum dot having a first tunable quantum-tunneling coupling to the first end of the first first-island nanowire and a second tunable quantum-tunneling coupling to the first end of the second second-island nanowire; and a second quantum dot having a third tunable quantum-tunneling coupling to the second end of the first first-island nanowire and a fourth tunable quantum tunneling coupling to the second end of the first second-island nanowire.

In some implementations, the quantum device comprises: a first superconducting island on which two or more first-island Majorana zero modes are located; a second superconducting island on which two or more second-island Majorana zero modes are located; a first quantum dot comprising a first tunable quantum-tunneling coupling to any of the first-island Majorana zero modes and a second tunable quantum-tunneling coupling to any of the second-island Majorana zero modes; and a second quantum dot comprising a third tunable quantum-tunneling coupling to any of the first-island Majorana zero modes to which the first quantum dot is not also actively coupled and a fourth tunable quantum-tunneling coupling to any of the second-island Majorana zero modes to which the first quantum dot is not also actively coupled.

For any of these implementations, the first superconducting island and the second superconducting can have respective charging energies that are held constant during operation of the quantum device in order to reduce quasiparticle poisoning. Further, the first quantum dot and the second quantum dot can have respective adjustable quantum dot charges.

Also disclosed herein are quantum computers comprising the topological quantum device of any of the disclosed embodiments.

In certain embodiments, a quantum computer phase gate comprising a quantum-dot-supported quantum device that is quasiparticle-poisoning-protected is disclosed.

In some implementations of these embodiments, the quantum device comprises: a first superconducting island on which one or more first-island nanowires are located, the one or more first-island nanowires including a first first-island nanowire having a first end and a second end distal to the first end; a second superconducting island on which one or more second-island nanowires are located, the one or more second-island nanowires including a first second-island nanowire having a first end and a second end distal to the first end; a first quantum dot having a first tunable quantum-tunneling coupling to the first end of the first first-island nanowire and a second tunable quantum-tunneling coupling to the first end of the first second-island nanowire; and a second quantum dot having a third tunable quantum-tunneling coupling to the second end of the first first-island nanowire and a fourth tunable quantum-tunneling coupling to the second end of the first second-island nanowire.

In certain implementations, the quantum device comprises: a first superconducting island on which two or more first-island nanowires are located, the two or more first-island nanowires including a first first-island nanowire having a first end and a second end distal to the first end, and a second first-island nanowire having a first end and a second end distal to the first end; a second superconducting island on which two or more second-island nanowires are located, including a first second-island nanowire having a first end and a second end distal to the first end, and a second second-island nanowire having a first end and a second end distal to the first end; a first quantum dot having a first tunable quantum-tunneling coupling to the second end of the first first-island nanowire and a second tunable quantum-tunneling coupling to the first end of the first second-island nanowire; and a second quantum dot having a third tunable quantum-tunneling coupling to the second end of the second first-island nanowire and a fourth tunable quantum tunneling coupling to the first end of the second second-island nanowire.

In further implementations, the quantum device comprises: a first superconducting island on which one or more first-island nanowires are located, the one or more first-island nanowires including a first first-island nanowire having a first end and a second end distal to the first end; a second superconducting island on which two or more second-island nanowires are located, including a first second-island nanowire having a first end and a second end distal to the first end, and a second second-island nanowire having a first end and a second end distal to the first end; a first quantum dot having a first tunable quantum-tunneling coupling to the first end of the first first-island nanowire and a second tunable quantum-tunneling coupling to the first end of the second second-island nanowire; and a second quantum dot having a third tunable quantum-tunneling coupling to the second end of the first first-island nanowire and a fourth tunable quantum tunneling coupling to the second end of the first second-island nanowire.

For any of these implementations, the first superconducting island and the second superconducting can have respective charging energies that are held constant during operation of the quantum device in order to reduce quasiparticle poisoning. Further, the first quantum dot and the second quantum dot can have respective adjustable quantum dot charges.

VIII. Concluding Remarks

Further examples and details concerning the disclosed technology, as well as other architectures with which the disclosed technology can be used, are described in T. Karzig et al., "Scalable Designs for Quasiparticle-Poisoning-Protected Topological Quantum Computation with Majorana Zero Modes," arXiv:1610.05289 (March 2017) and T. Karzig et al., "Scalable Designs for Quasiparticle-Poisoning-Protected Topological Quantum Computation with Majorana Zero Modes, "Phys. Rev. B 95, 235305 (2017), both of which are hereby incorporated herein by reference in their entirety.

Having described and illustrated the principles of the disclosed technology with reference to the illustrated embodiments, it will be recognized that the illustrated embodiments can be modified in arrangement and detail without departing from such principles. In view of the many possible embodiments to which the principles of the disclosed invention may be applied, it should be recognized that the illustrated embodiments are only preferred examples of the invention and should not be taken as limiting the scope of the invention.

What is claimed is:

1. A quantum-dot-supported topological quantum device that is quasiparticle-poisoning-protected, wherein the quantum device comprises:
   a first superconducting island on which one or more first-island nanowires are located, the one or more first-island nanowires including a first first-island nanowire having a first end and a second end distal to the first end;
   a second superconducting island on which one or more second-island nanowires are located, the one or more second-island nanowires including a first second-island nanowire having a first end and a second end distal to the first end;
   a first quantum dot having a first tunable quantum-tunneling coupling to the first end of the first first-island nanowire and a second tunable quantum-tunneling coupling to the first end of the first second-island nanowire; and
   a second quantum dot having a third tunable quantum-tunneling coupling to the second end of the first first-island nanowire and a fourth tunable quantum-tunneling coupling to the second end of the first second-island nanowire.

2. A quantum-dot-supported topological quantum device that is quasiparticle-poisoning-protected, wherein the quantum device comprises:
   a first superconducting island on which two or more first-island nanowires are located, the two or more first-island nanowires including a first first-island nanowire having a first end and a second end distal to the first end, and a second first-island nanowire having a first end and a second end distal to the first end;
   a second superconducting island on which two or more second-island nanowires are located, including a first second-island nanowire having a first end and a second end distal to the first end, and a second second-island nanowire having a first end and a second end distal to the first end;
   a first quantum dot having a first tunable quantum-tunneling coupling to the second end of the first first-island nanowire and a second tunable quantum-tunneling coupling to the first end of the first second-island nanowire; and
   a second quantum dot having a third tunable quantum-tunneling coupling to the second end of the second first-island nanowire and a fourth tunable quantum tunneling coupling to the first end of the second second-island nanowire.

3. A quantum-dot-supported topological quantum device that is quasiparticle-poisoning-protected, wherein the quantum device comprises:
   a first superconducting island on which one or more first-island nanowires are located, the one or more first-island nanowires including a first first-island nanowire having a first end and a second end distal to the first end;
   a second superconducting island on which two or more second-island nanowires are located, including a first second-island nanowire having a first end and a second end distal to the first end, and a second second-island nanowire having a first end and a second end distal to the first end;
   a first quantum dot having a first tunable quantum-tunneling coupling to the first end of the first first-island nanowire and a second tunable quantum-tunneling coupling to the first end of the second second-island nanowire; and
   a second quantum dot having a third tunable quantum-tunneling coupling to the second end of the first first-island nanowire and a fourth tunable quantum tunneling coupling to the second end of the first second-island nanowire.

4. A quantum-dot-supported topological quantum device that is quasiparticle-poisoning-protected, wherein the quantum device comprises:
   a first superconducting island on which two or more first-island Majorana zero modes are located;
   a second superconducting island on which two or more second-island Majorana zero modes are located;
   a first quantum dot comprising a first tunable quantum-tunneling coupling to any of the first-island Majorana zero modes and a second tunable quantum-tunneling coupling to any of the second-island Majorana zero modes; and
   a second quantum dot comprising a third tunable quantum-tunneling coupling to any of the first-island Majorana zero modes to which the first quantum dot is not also coupled and a fourth tunable quantum-tunneling coupling to any of the second-island Majorana zero modes to which the first quantum dot is not also coupled.

5. The topological quantum device of claim 4, wherein the first superconducting island and the second superconducting island have respective charging energies that are held constant during operation of the quantum device in order to reduce quasiparticle poisoning.

6. A method for operating a quantum device, comprising:
measuring a collective topological charge of a plurality of non-Abelian quasiparticles using quantum dots; and
using the measurement of the topological charge to implement the full set of Clifford gates in a quantum computer,
wherein the non-Abelian quasiparticles are Majorana zero modes, and
wherein the measuring comprises measuring a joint parity P of the Majorana zero modes using the quantum dots, the joint parity being the product of the topological charge of the plurality of the Majorana zero modes.

7. The method of claim 6, wherein a first and a second of the Majorana zero modes are implemented on a first superconducting island, and
wherein a third and a fourth of the Majorana zero modes are implemented on a second superconducting island separate from the first superconducting island.

8. The method of claim 6, wherein the measuring is performed using one of (a) spectroscopy; (b) a microwave resonator; or (c) measuring quantum capacitance.

9. A method for operating a quantum system, comprising:
altering gate voltages at a set of gates to create tunnel couplings between one or more quantum dots and two or more Majorana zero modes, the tunnel couplings altering energy levels of the one or more quantum dots, resulting in a hybridization of quantum states in the quantum system;
measuring a hybridization energy of the quantum system; and
determining a joint parity of the two or more Majorana zero modes based on the measured hybridization.

10. The method of claim 9, further comprising: altering the gate voltages at the set of gates to decouple the one or more quantum dots from the two or more Majorana zero modes.

11. The method of claim 10, further comprising measuring respective charges of the one or more quantum dots.

12. The method of claim 9, wherein the method further comprises using the joint parity to implement the full set of Clifford gates in a quantum computer.

13. The method of claim 9, wherein the two or more Majorana zero modes are part of a general phase gate in a quantum computer.

14. The method of any of claim 9, wherein the measuring is performed using one of (a) spectroscopy; (b) a microwave resonator; (c) a measurement of quantum capacitance; or (d) charge sensing.

15. A quantum computer phase gate comprising a quantum-dot-supported quantum device that is quasiparticle-poisoning-protected, wherein the quantum device comprises one of:

(a)
a first superconducting island on which one or more first-island nanowires are located, the one or more first-island nanowires including a first first-island nanowire having a first end and a second end distal to the first end;
a second superconducting island on which one or more second-island nanowires are located, the one or more second-island nanowires including a first second-island nanowire having a first end and a second end distal to the first end;
a first quantum dot having a first tunable quantum-tunneling coupling to the first end of the first first-island nanowire and a second tunable quantum-tunneling coupling to the first end of the first second-island nanowire; and a second quantum dot having a third tunable quantum-tunneling coupling to the second end of the first first-island nanowire and a fourth tunable quantum-tunneling coupling to the second end of the first second-island nanowire;

(b)
a first superconducting island on which two or more first-island nanowires are located, the two or more first-island nanowires including a first first-island nanowire having a first end and a second end distal to the first end, and a second first-island nanowire having a first end and a second end distal to the first end;
a second superconducting island on which two or more second-island nanowires are located, including a first second-island nanowire having a first end and a second end distal to the first end, and a second second-island nanowire having a first end and a second end distal to the first end;
a first quantum dot having a first tunable quantum-tunneling coupling to the second end of the first first-island nanowire and a second tunable quantum-tunneling coupling to the first end of the first second-island nanowire; and
a second quantum dot having a third tunable quantum-tunneling coupling to the second end of the second first-island nanowire and a fourth tunable quantum tunneling coupling to the first end of the second second-island nanowire; or (c)
a first superconducting island on which one or more first-island nanowires are located, the one or more first-island nanowires including a first first-island nanowire having a first end and a second end distal to the first end;
a second superconducting island on which two or more second-island nanowires are located, including a first second-island nanowire having a first end and a second end distal to the first end, and a second second-island nanowire having a first end and a second end distal to the first end;
a first quantum dot having a first tunable quantum-tunneling coupling to the first end of the first first-island nanowire and a second tunable quantum-tunneling coupling to the first end of the second second-island nanowire; and
a second quantum dot having a third tunable quantum-tunneling coupling to the second end of the first first-island nanowire and a fourth tunable quantum tunneling coupling to the second end of the first second-island nanowire.

16. The quantum computer phase gate of claim 15, wherein the first superconducting island and the second superconducting have respective charging energies that are held constant during operation of the quantum device in order to reduce quasiparticle poisoning.

17. The quantum computer phase gate of claim 15, wherein the first quantum dot and the second quantum dot have respective adjustable quantum dot charges.

* * * * *